United States Patent
Ning et al.

(10) Patent No.: US 8,952,387 B2
(45) Date of Patent: Feb. 10, 2015

(54) THIN FILM TRANSISTOR ARRAY SUBSTRATE AND METHOD FOR MANUFACTURING THE SAME

(71) Applicant: BOE Technology Group Co., Ltd., Beijing (CN)

(72) Inventors: Ce Ning, Beijing (CN); Xuehui Zhang, Beijing (CN); Jing Yang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 13/822,920

(22) PCT Filed: Nov. 28, 2012

(86) PCT No.: PCT/CN2012/085482
§ 371 (c)(1),
(2) Date: Mar. 13, 2013

(87) PCT Pub. No.: WO2013/131384
PCT Pub. Date: Sep. 12, 2013

(65) Prior Publication Data
US 2014/0183519 A1    Jul. 3, 2014

(30) Foreign Application Priority Data
Mar. 5, 2012   (CN) .......................... 2012 1 0055454

(51) Int. Cl.
*H01L 29/04*    (2006.01)
*H01L 29/15*    (2006.01)
(Continued)

(52) U.S. Cl.
CPC .......... *H01L 27/1225* (2013.01); *H01L 27/124* (2013.01); *H01L 27/1288* (2013.01);
(Continued)

(58) Field of Classification Search
USPC ........ 257/43, 59, 72, 291, E21.411, E29.117, 257/E29.151, E29.202, E29.273; 438/149, 438/151
See application file for complete search history.

(56) References Cited

U.S. PATENT DOCUMENTS 7,161,183 B2 *   1/2007   Nakayama et al. ............. 257/79
7,599,038 B2 *   10/2009   Oda .............................. 349/149
(Continued)

FOREIGN PATENT DOCUMENTS

CN    101060123 A    10/2007
CN    101846857 A    9/2010
(Continued)

OTHER PUBLICATIONS

First Chinese Office Action dated Sep. 22, 2013; Appln. No. 201210055454.X.
(Continued)

*Primary Examiner* — Ida M Soward
(74) *Attorney, Agent, or Firm* — Ladas & Parry LLP (57) ABSTRACT

According to embodiments of the present invention, there are provided a TFT array substrate, a method for manufacturing the TFT array substrate and an electronic device. The method for manufacturing the TFT array substrate includes: a first patterning process, in which a pattern of a pixel electrode formed by a first transparent conductive layer and patterns of a drain electrode and a source electrode that are separated from each other and a data line, which are formed by a first metal layer, are formed on a transparent substrate; a second patterning process, in which a pattern of a gate insulating layer and a pattern of an active layer formed by a transparent oxide layer are formed on the transparent substrate subjected to the first patterning process; and a third patterning process, in which a pattern of a common electrode formed by a second transparent conductive layer and patterns of a gate electrode and a gate line which are formed by a second metal layer are formed on the transparent substrate subjected to the second patterning process.

12 Claims, 5 Drawing Sheets

(51) Int. Cl.
*H01L 31/036* (2006.01)
*H01L 29/10* (2006.01)
*H01L 29/12* (2006.01)
*H01L 31/0376* (2006.01)
*H01L 31/20* (2006.01)
*H01L 31/062* (2012.01)
*H01L 31/113* (2006.01)
*H01L 21/00* (2006.01)
*H01L 21/84* (2006.01)
*H01L 27/12* (2006.01)
*H01L 21/3213* (2006.01)
*G02F 1/1362* (2006.01)

(52) U.S. Cl.
CPC ......... *H01L27/127* (2013.01); *H01L 21/32139* (2013.01); *G06F 2001/136236* (2013.01); *G02F 2001/13629* (2013.01)
USPC ................. 257/72; 257/43; 257/59; 257/291; 257/E21.411; 257/E29.117; 257/E29.151; 257/E29.202; 257/E29.273; 438/149; 438/151

(56) References Cited

U.S. PATENT DOCUMENTS

| | | | |
|---|---|---|---|
| 7,688,410 B2* | 3/2010 | Kim et al. | 349/114 |
| 7,760,276 B2* | 7/2010 | Ahn et al. | 349/39 |
| 7,952,099 B2* | 5/2011 | Deng et al. | 257/72 |
| 7,960,730 B2* | 6/2011 | Lee et al. | 257/57 |
| 8,072,430 B2* | 12/2011 | Kim et al. | 345/173 |
| 8,130,349 B2* | 3/2012 | Park et al. | 349/129 |
| 8,134,674 B2* | 3/2012 | Lim et al. | 349/142 |
| 8,298,878 B2* | 10/2012 | Yoo et al. | 438/149 |
| 8,421,083 B2* | 4/2013 | Yamazaki et al. | 257/71 |
| 8,461,582 B2* | 6/2013 | Kimura | 257/43 |
| 8,604,484 B2* | 12/2013 | Kim | 257/72 |
| 8,730,417 B2* | 5/2014 | Cho et al. | 349/33 |
| 2001/0040663 A1 | 11/2001 | Jun | |
| 2002/0050966 A1* | 5/2002 | Asao et al. | 345/87 |
| 2007/0024766 A1* | 2/2007 | Song et al. | 349/42 |
| 2007/0215945 A1* | 9/2007 | Tokunaga et al. | 257/347 |
| 2007/0246707 A1 | 10/2007 | Deng et al. | |
| 2010/0032665 A1 | 2/2010 | Yamazaki et al. | |
| 2010/0134734 A1* | 6/2010 | Kim et al. | 349/114 |
| 2010/0295049 A1 | 11/2010 | Yoo et al. | |
| 2011/0088770 A1* | 4/2011 | Allemand et al. | 136/256 |
| 2012/0107982 A1 | 5/2012 | Song et al. | |
| 2012/0162162 A1* | 6/2012 | Kong et al. | 345/205 |

FOREIGN PATENT DOCUMENTS

| | | |
|---|---|---|
| CN | 101894807 A | 11/2010 |
| CN | 102148196 A | 8/2011 |
| CN | 102709237 A | 10/2012 |
| JP | 2007-318144 A | 12/2007 |
| KR | 20070104296 A | 10/2007 |
| KR | 20100019379 A | 2/2010 |
| KR | 20100126228 A | 12/2010 |

OTHER PUBLICATIONS

Second Chinese Office Action dated Dec. 24, 2013; Appln. No. 201210055454.X.

Third Chinese Office Action dated Feb. 27, 2014; Appln. No. 2012100055454.X.

Korean Office Action Dated Feb. 17, 2014; Appln. No. 10-2013-7010103.

International Search Report dated Jul. 3, 2013; PCT/CN2012/085482.

International Preliminary Report on Patentability Appln. No. PCT/CN2012/085482; Issued Sep. 9, 2014.

* cited by examiner

THIN FILM TRANSISTOR ARRAY SUBSTRATE AND METHOD FOR MANUFACTURING THE SAME

TECHNICAL FIELD

Embodiments of the present invention relate to a thin film transistor array substrate, a method for manufacturing the same and an electronic device.

BACKGROUND

In prior art, the overwhelming majority of flat panel displays are active matrix liquid crystal displays (AMLCDs), and because the large-area fabrication of amorphous silicon (a-Si) at a low temperature is easily realized and is mature in technology. the related technology has become the most widely used one.

Thin film transistor liquid crystal displays (TFT-LCDs) belong to one kind of the active matrix liquid crystal displays. In accordance with the direction of the electric field for driving liquid crystals, TFT-LCDs can be classified into a vertical electric field mode, a horizontal electric field mode and a multi-dimensional electric field mode, and the vertical electric field mode includes a twisted nematic (briefly called as TN) mode TFT-LCD, the horizontal electric field mode includes an In-Plane Switch (IPS) mode TFT-LCD, and the multi-dimensional electric field mode includes an advanced super dimensional switch (ADSDS or ADS) mode TFT-LCD.

In an ADS mode TFT-LCD, a multi-dimensional electric field is formed with an electric field produced at edges of slit electrodes on a same plane and an electric field produced between a layer of the slit electrodes and a layer of a plate-like electrode, so as to allow liquid crystal molecules at all alignment within a liquid crystal cell, which are provided directly above the electrode and between the slit electrodes, to be rotated, thereby enhancing the work efficiency of liquid crystals and increasing the transmissive efficiency. The advanced-super dimensional switching technology can improve the picture quality of TFT-LCD products, and has advantages such as high resolution, high transmittance, low power consumption, wide viewing angle, high opening ratio, low chromatic aberration, push Mura-free, etc.

Additionally, transparent oxide TFTs are a kind of thin film transistors and are rapidly developed recently, and get ever-increasing attention due to their many advantages. Transparent oxide TFTs have advantages such as high mobility, good uniformity, transparency, simple manufacturing process, etc., and can better meet the requirements of a large-scale liquid crystal display. Furthermore, the manufacturing process of the transparent oxide TFTs match the production line for the LCDs in prior art well and the transferring can be easily realized.

However, the manufacturing process of a transparent oxide TFT array substrate in prior art is relatively complex, and at least four patterning processes are needed for completion, leading to higher production costs.

SUMMARY

In an embodiment of the present invention, there is provided a method for manufacturing a thin film transistor array substrate, comprising: a first patterning process, in which a pattern of a pixel electrode formed by a first transparent conductive layer and patterns of a drain electrode and a source electrode that are separated from each other and a data line, which are formed by a first metal layer, are formed on a transparent substrate; a second patterning process, in which a pattern of a gate insulating layer and a pattern of an active layer formed by a transparent oxide layer are formed on the transparent substrate subjected to the first patterning process; and a third patterning process, in which a pattern of a common electrode formed by a second transparent conductive layer and patterns of a gate electrode and a gate line which are formed by a second metal layer are formed on the transparent substrate subjected to the second patterning process.

In another embodiment of the present invention, there is provided a thin film transistor array substrate comprising: a transparent substrate; a pixel electrode, which is provided on the transparent substrate and formed by a first transparent conductive layer; a source electrode, a drain electrode and a data line, which are provided on the pixel electrode and formed by a first metal layer; an active layer, which is provided on the transparent substrate and formed by a transparent oxide layer; a gate insulating layer, which is provided on the active layer; a common electrode, which is provided on the gate insulating layer and formed by a second transparent conductive layer; and a gate electrode and a gate line, which are provided on the common electrode and formed by a second metal layer.

In another embodiment of the present invention, there is provided an electronic device comprising the above thin film transistor array substrate.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

As to the problem that a transparent oxide TFT array substrate in prior art has a relatively complex manufacturing process and leads to high production costs, according to an embodiment of the invention, there are provided a thin film transistor array substrate and a method for manufacturing the same, in which the transparent oxide TFT array substrate can be manufactured provided with three patterning processes, the manufacturing process of the transparent oxide TFT array substrate can be simplified, and the manufacturing period thereof can be shortened, thereby reducing production costs. According to an embodiment of the invention, there is further provided an electronic device comprising the above thin film transistor array substrate.

A method for manufacturing a thin film transistor array substrate provided by an embodiment of the invention can comprise:

Step 101: a first patterning process, in which a pattern of a pixel electrode foamed by a first transparent conductive layer and patterns of a drain electrode and a source electrode that are separated from each other and a data line, which are formed by a first metal layer, are formed on a transparent substrate;

Step 102: a second patterning process, in which a pattern of a gate insulating layer and a pattern of an active layer formed by a transparent oxide layer are formed on the transparent substrate subjected to the first patterning process; and Step 103: a third patterning process, in which a pattern of a common electrode formed by a second transparent conductive layer and patterns of a gate electrode and a gate line which are formed by a second metal layer are formed on the transparent substrate subjected to the second patterning process.

As stated above, with the method for manufacturing a thin film transistor array substrate according to the embodiment of the invention, only three patterning processes are needed to manufacture the transparent oxide TFT array substrate, and the manufacturing process of the transparent oxide TFT array substrate is simplified. Because the number of the patterning processes can be decreased, the manufacturing period can be decreased, and in turn, production costs can be reduced. Because the array substrate fabricated by the embodiment of the invention adopts a transparent oxide thin film transistor, the TFT array substrate possesses remarkably improved characteristics and moreover has advantages such as high opening ratio, high mobility, wide viewing angle, etc.

Figure 1:
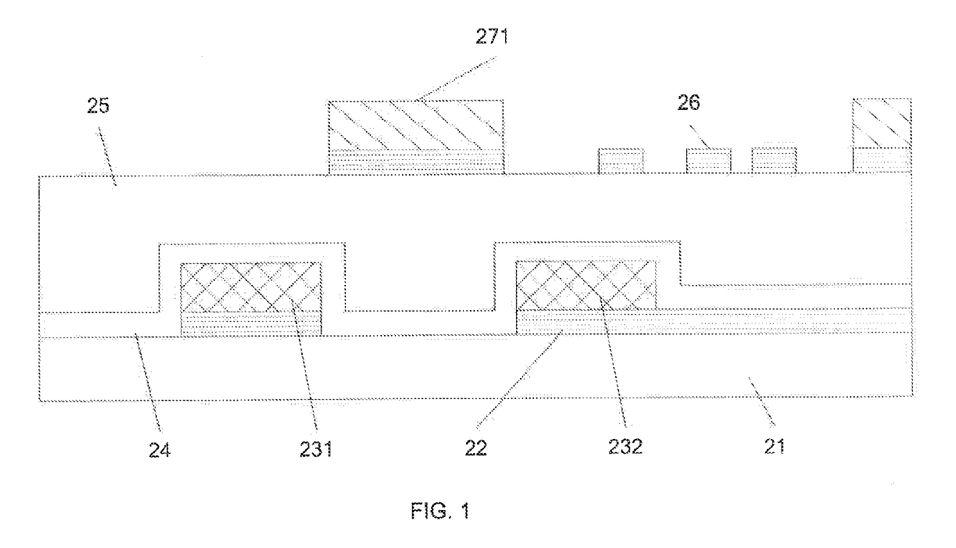
FIG. 1 is a structurally schematic view showing a thin film transistor array substrate according to an embodiment of the invention.

FIG. 1 is a structurally schematic view showing a thin film transistor array substrate provided by an embodiment of the invention. As shown in FIG. 1, the thin film transistor array substrate provided by the embodiment of the invention may comprise: a transparent substrate (for example, a glass substrate); a pixel electrode 22, which is provided on the transparent substrate 1 and formed by a first transparent conductive layer; a source electrode 231 and a drain electrode 232 that are separated from each other and a data line 23, which are provided on the pixel electrode 22 and formed by a first metal layer; an active layer 24, which is provided on the transparent substrate 21 and formed by a transparent oxide, wherein the active layer 24 is fainted to cover the source electrode 231 and the drain electrode 232; a gate insulating layer 25 provided on the active layer 24; a common electrode 26, which is provided on the gate insulating layer 25 and formed by a second transparent conductive layer; and a gate electrode 271 and a gate line 27, which are provided on the common electrode 26 and formed by a second metal layer.

The thin film transistor array substrate according to the embodiment of the invention can be manufactured by using three patterning processes, and the manufacturing process of the transparent oxide TFT array substrate can be simplified. Because the number of the patterning process is decreased, the manufacturing period can be decreased, and in turn, production costs can be reduced. The array substrate according to the embodiment of the invention adopts a transparent oxide thin film transistor, the TFT array substrate possesses remarkably improved characteristics and moreover has advantages such as high opening ratio, high mobility, wide viewing angle, etc.

According to an embodiment of the invention, there is further provided an electronic device comprising the above-mentioned thin film transistor array substrate. The electronic device provided by the embodiment of the invention may be a liquid crystal panel, an electronic paper display panel, a liquid crystal television, an electronic reader, or the like, but embodiments of the invention are not limited thereto.

Figure 2:
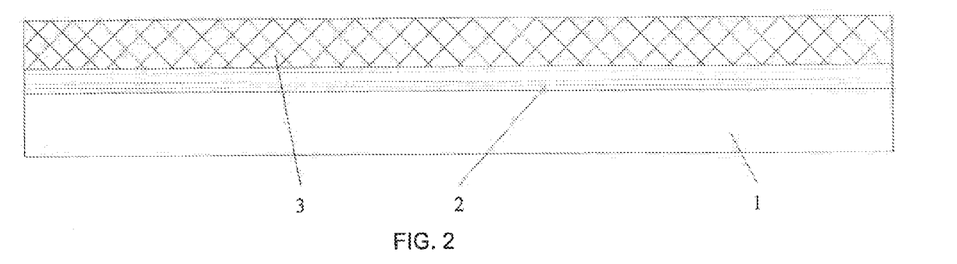
FIG. 2 is a schematic view showing a cross section after a first transparent conductive layer and a first metal layer are deposited in a first patterning process according to an embodiment of the invention.

A method for manufacturing a thin film transistor array substrate provided by an embodiment of the invention will be described in detail below with reference to FIG. 2 to FIG. 8. The method for manufacturing the thin film transistor array substrate provided by the embodiment of the invention can comprise the following steps:

Step 101: a first patterning process, in which a pattern of a pixel electrode formed by a first transparent conductive layer and patterns of a drain electrode and a source electrode that are separated from each other and a data line, which are formed by a first metal layer, are formed on a transparent substrate;

Firstly, as shown in FIG. 2, a first transparent conductive layer 2 with a thickness in the range of 40~70 nm is deposited on a transparent substrate 1 by means of magnetron sputtering; and then, a first metal layer 3 with a thickness in the range of 200~400 nm is deposited on the first transparent conductive layer 2 by means of magnetron sputtering again.

Figure 3:
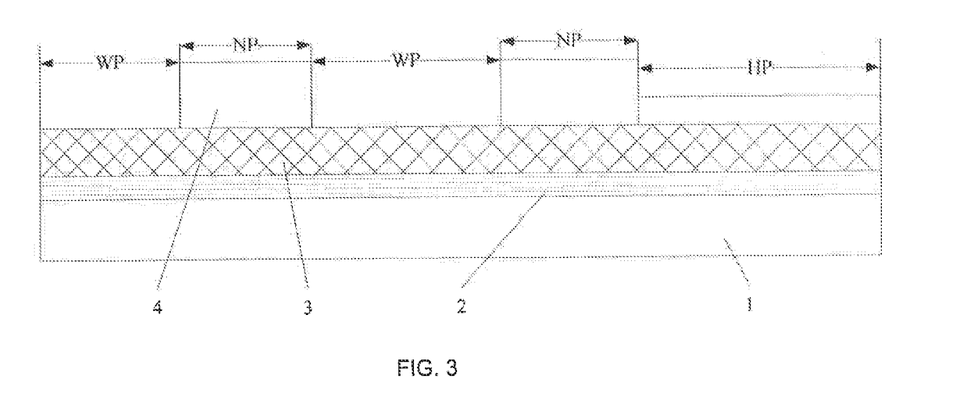
FIG. 3 is a schematic view showing the cross section after exposure and development are performed by using a grey-tone or half-tone mask in the first patterning process according to the embodiment of the invention.

Next, as shown in FIG. 3, a photoresist layer is coated on the first metal layer 3, and exposure and development are performed on the photoresist layer 3 with a half-tone mask plate so as to form a photoresist mask 4. In the structure shown in FIG. 3, WP is a photoresist-free region, HP is a photoresist partially-retained region, NP is a photoresist fully-retained region, and the photoresist mask 4 comprises photoresist in the photoresist partially-retained region HP and the photoresist fully-retained region NP.

Figure 4:
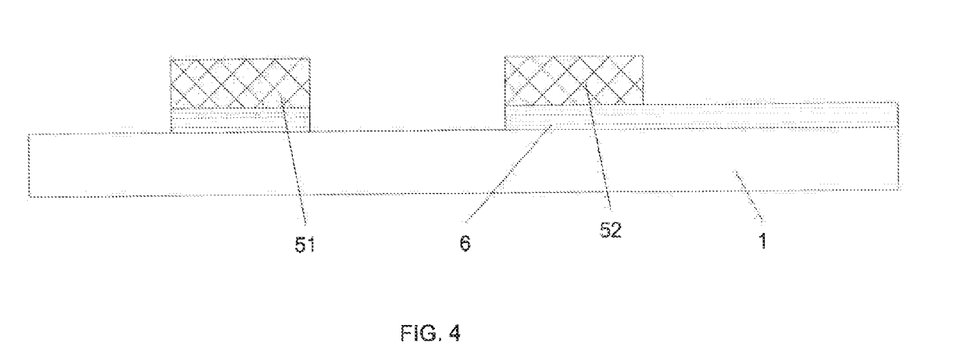
FIG. 4 is a schematic view showing the cross section after first and second etchings are performed in the first patterning process according to the embodiment of the invention.

Then, as shown in FIG. 4, with the photoresist mask 4 as an etching mask, a first etching is performed so as to form a drain electrode 52, a source electrode 51 and a data line 5; next, an ashing process is performed on the photoresist mask 4, and the photoresist mask 4 subjected to the ashing process only includes the photoresist in the photoresist fully-retained region NP; and then, with the photoresist mask 4 subjected to the ashing process as an etching mask, a second etching is performed so as to form a pixel electrode 6.

In the embodiment of the invention, for example, the thickness of the first transparent conductive layer 2 may be 40 nm. Further, in the embodiment of the invention, Indium Zinc Oxide (IZO), Indium Tin Oxide (ITO) or the like transparent conductive material can be used for the first transparent conductive layer 2, at least one of Cr, W, Ti, Ta, Mo, Al and Cu can be used for the first metal layer 3, but embodiments of the invention are not limited thereto.

As can be appreciated by those skilled in the art, implementation of the first patterning process in step 101 is not limited to the foregoing scheme. For example, in some embodiments of the invention, another like double-tone mask plate, such as a grey-tone mask plate, can be used to replace the half-tone mask plate for exposure and development.

Figure 5:
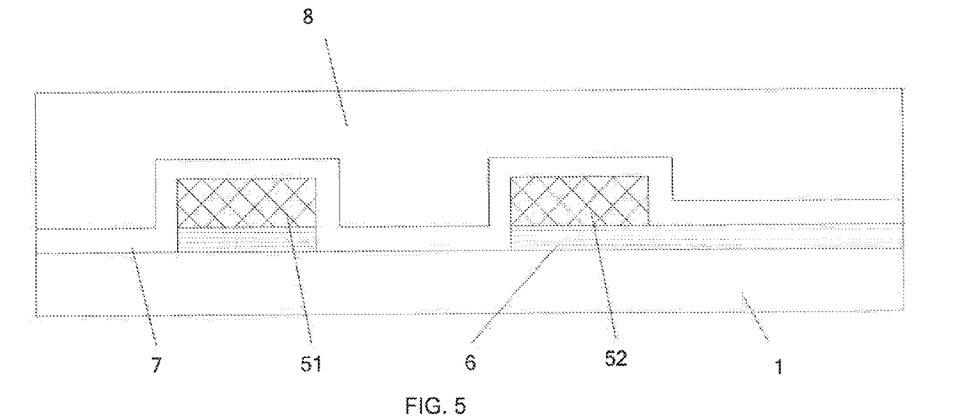
FIG. 5 is a schematic view showing the cross section after first and second etchings are performed in a second patterning process according to the embodiment of the invention.

Step 102: a second patterning process, in which a pattern of a gate insulating layer and a pattern of an active layer formed by a transparent oxide layer are formed on the transparent substrate subjected to the first patterning process;

Firstly, as shown in FIG. 5, on the transparent substrate subjected to step 101, a transparent oxide layer with a thickness in the range of 20~50 nm is deposited by means of magnetron sputtering; and then, a gate insulating layer with a thickness in the range of 300~400 nm is deposited by means of magnetron sputtering.

In the embodiment of the invention, for example, the thickness of the gate insulating layer is 400 nm. Further, in the embodiment of the invention, Indium Gallium Zinc Oxide (IGZO), Zinc Oxide (ZnO) or IZO can be used for the transparent oxide layer, aluminum oxide (Al2O3) or aluminum nitride (AlN) can be used for the gate insulating layer, but embodiments of the invention are not limited thereto.

Alternatively, in some embodiments of the invention, a plasma enhanced chemical vapor deposition (PECVD) method can be used to replace magnetron sputtering for deposition of the gate insulating layer, and in this case, silicon oxide (SiO2) or silicon nitride (SiNx) can be used for the gate insulating layer.

Next, a photoresist layer is coated on the gate insulating layer, and exposure and development are performed on the photoresist layer with a half-tone mask plate so as to form a photoresist mask. Then, with the photoresist mask as an etching mask, a first dry etching (for example, reactive ion etching (RIE)) is performed so that the gate insulating layer over the data line is removed and pattern 8 of the gate insulating layer is formed. Next, after an ashing process is performed on the photoresist mask, with the photoresist mask subjected to the ashing process as an etching mask, a second wet etching is performed so that the data line is exposed and pattern 7 of an active layer. Thus, structure as shown in FIG. 5 is obtained.

As can be appreciated by those skilled in the art, implementation of the second patterning process in step 102 is not limited to the foregoing scheme. For example, in some embodiments of the invention, another like double-tone mask plate, such as a grey-tone mask plate, can be used to replace the half-tone mask for exposure and development; further, a wet etching scheme can also be used to replace the dry etching scheme for etching of the gate insulating layer.

Step 103: a third patterning process, in which a pattern of a common electrode formed by a second transparent conductive layer and patterns of a gate electrode and a gate line which are formed by a second metal layer are formed on the transparent substrate subjected to the second patterning process.

Figure 6:
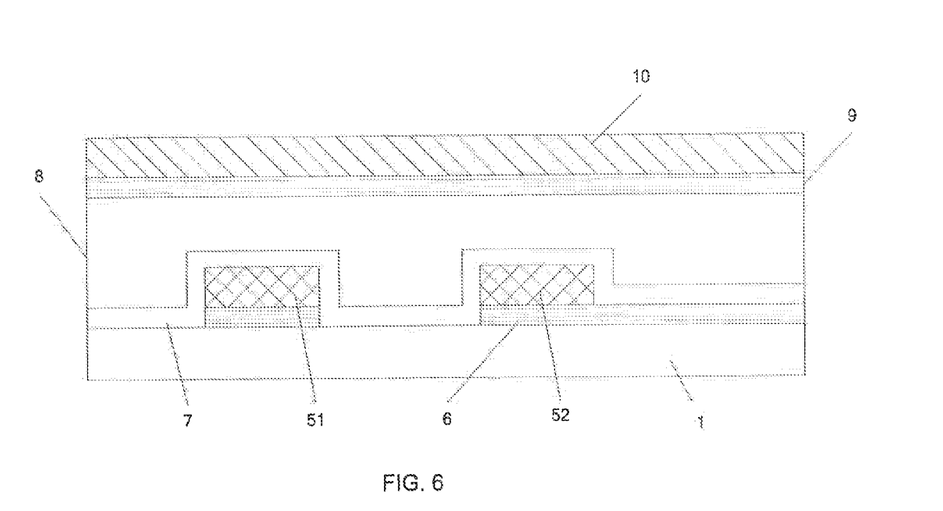
FIG. 6 is a schematic view showing the cross section after a second transparent conductive layer and a second metal layer are deposited in a third patterning process according to the embodiment of the invention.

Firstly, as shown in FIG. 6, a second transparent conductive layer 9 with a thickness in the range of 40~70 nm and a second metal layer 10 with a thickness in the range of 200 nm~400 nm are deposited on the transparent substrate subjected to step 102 by means of magnetron sputtering.

Figure 7:
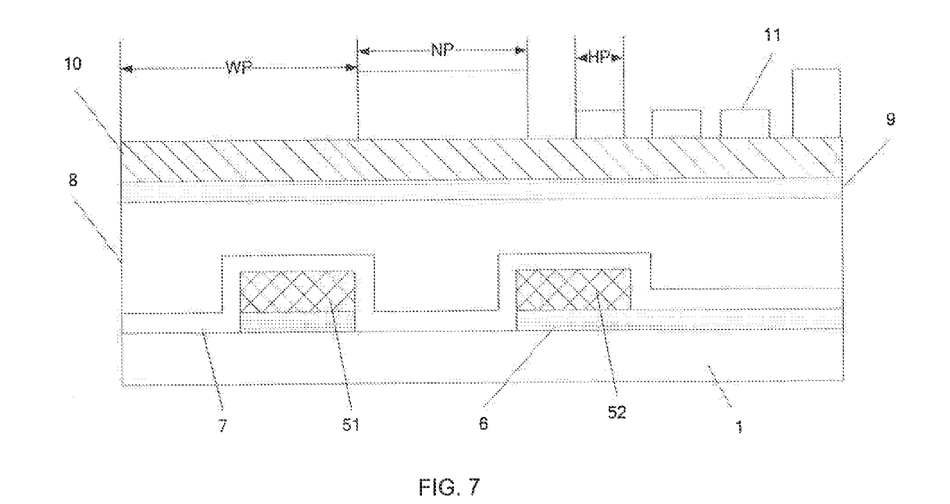
FIG. 7 is a schematic view showing the cross section after exposure and development are performed by using a grey-tone or half-tone mask in the third patterning process according to the embodiment of the invention.

Next, as shown in FIG. 7, a photoresist layer is coated on the second metal layer 10, and exposure and development are performed on the photoresist layer with a half-tone mask plate so as to form a photoresist mask 11. In the structure shown in FIG. 7, WP is a photoresist-free region, HP is a photoresist partially-retained region, NP is a photoresist fully-retained region, and the photoresist mask 11 comprises photoresist in the photoresist partially-retained region HP and the photoresist fully-retained region NP.

Figure 8:
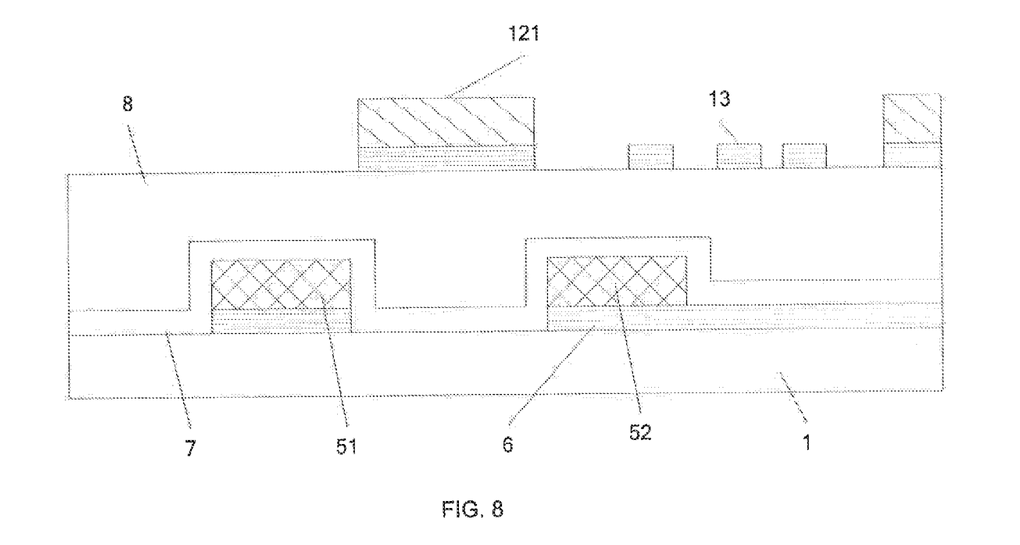
FIG. 8 is a schematic view showing the cross section of a transparent oxide TFT array substrate after first and second etchings are formed in the third patterning process according to the embodiment of the invention.
Figure 9:
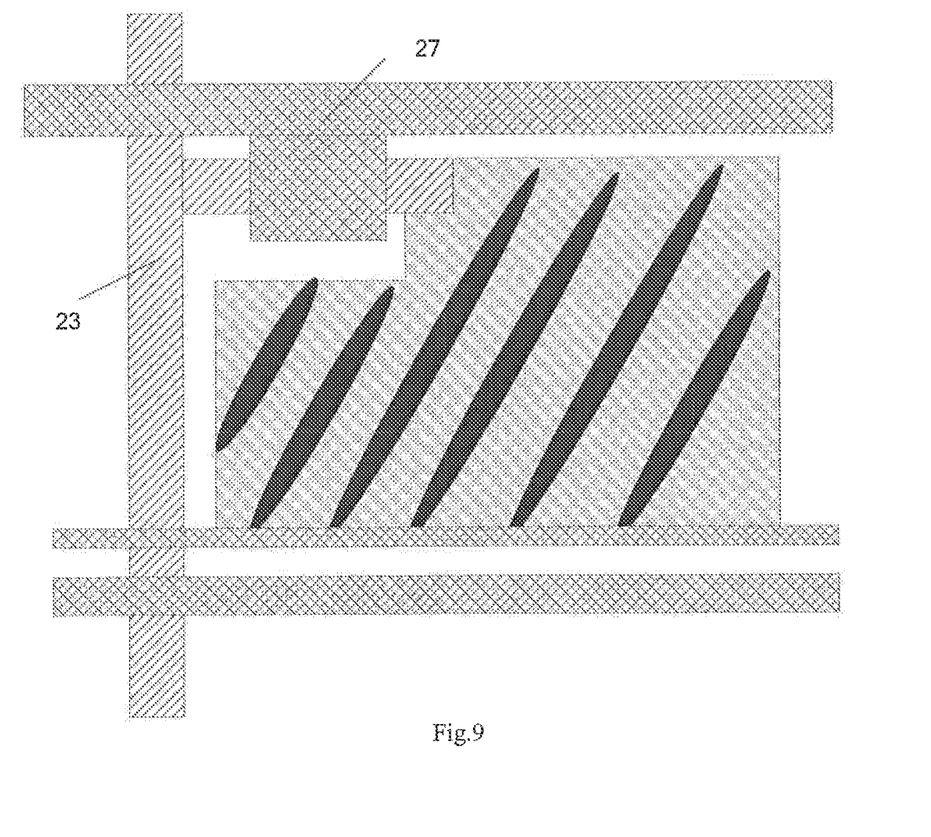
FIG. 9 is a structurally schematic plan view showing a thin film transistor array substrate according to an embodiment of the invention.

Then, as shown in FIG. 8, with the photoresist mask 11 as an etching mask. a first etching is performed so as to form a gate electrode 121 and a gate line 12 which are formed by the second metal layer 10; next, an ashing process is performed on the photoresist mask 11. and the photoresist mask 11 subjected to the ashing process only includes the photoresist in the photoresist fully-retained region NP; and then, with the photoresist mask 11 subjected to the ashing process as an etching mask, a second etching is performed so as to form a common electrode 13 which is formed by the second transparent conductive layer 9.

In the embodiment of the invention, for example, the thickness of the second transparent conductive layer 9 is 40 nm. Further, in the embodiment of the invention, IZO or ITO can be used for the second transparent conductive layer 9, at least one of Cr, W, Ti, Ta, Mo, Al and Cu can be used for the second metal layer 10, but embodiments of the invention are not limited thereto.

As can be appreciated by those skilled in the art, implementation of the third patterning process in step 103 is not limited to the foregoing scheme. For example, in some embodiments of the invention, another like double-tone mask plate or a grey-tone mask plate can be used to replace the half-tone mask plate for exposure and development.

As stated above, in the embodiment of the invention, only three patterning processes are needed for the manufacture of a transparent oxide TFT thin film transistor array substrate, and the manufacturing process of the transparent oxide TFT array substrate can be simplified. Because the number of the patterning processes is decreased and the number of the photolithography processes and the deposition processes for a protective layer are decreased, the manufacturing period can be decreased, and in turn, the production costs are reduced. The array substrate according to the embodiment of the invention adopts a transparent oxide thin film transistor, the TFT array substrate possesses remarkably improved characteristics and moreover has advantages such as high opening ratio, high mobility, wide viewing angle, etc.

The above embodiments are merely used to illustrate technical solutions of the present invention, but not used to describe limitations thereto. Although the present invention has been explained in detail with reference to the forgoing embodiments, it should be appreciated by those ordinarily skilled in the art that, they can still make modifications to the technical solutions illustrated by the foregoing embodiments or make equivalent replacements of a part of technical features thereof; and these modification or equivalent replacements do not make the essence of corresponding technical solutions depart from the spirits and scopes of technical solutions of embodiments of the present invention.

The invention claimed is:

1. A method for manufacturing a thin film transistor array substrate, comprising:
  a first patterning process, in which a pattern of a pixel electrode formed by a first transparent conductive layer and patterns of a drain electrode and a source electrode that are separated from each other and a data line, which are formed by a first metal layer, are formed on a transparent substrate;

a second patterning process, in which a pattern of a gate insulating layer and a pattern of an active layer formed by a transparent oxide layer are formed on the transparent substrate subjected to the first patterning process; and a third patterning process, in which a pattern of a common electrode formed by a second transparent conductive layer and patterns of a gate electrode and a gate line which are formed by a second metal layer are formed on the transparent substrate subjected to the second patterning process.

2. The method for manufacturing the thin film transistor array substrate claimed as claim 1, wherein, the first patterning process comprises:

sequentially depositing the first transparent conductive layer and the first metal layer on the transparent substrate;

coating a photoresist layer on the first metal layer; and etching after exposure and development are performed on the photoresist layer with a double-tone mask, so as to form the patterns of the drain electrode and the source electrode, that are separated from each other, and the data line, which are formed by the first metal layer; and etching again after an ashing process is performed on the photoresist layer, so as to form the pattern of the pixel electrode formed by the first transparent conductive layer.

3. The method for manufacturing the thin film transistor array substrate claimed as claim 2, wherein the sequentially depositing of the first transparent conductive layer and the first metal layer on the transparent substrate comprises:

depositing the first transparent conductive layer with a thickness in the range of 40~70 nm and the first metal layer with a thickness in the range of 200~400 nm on the transparent substrate by means of magnetron sputtering.

4. The method for manufacturing the thin film transistor array substrate claimed as claim 3, wherein IZO or ITO is applicable for the first transparent conductive layer; and at least one of Cr, W, Ti, Ta, Mo, Al and Cu is applicable for the first metal layer.

5. The method for manufacturing the thin film transistor array substrate claimed as claim 1, wherein the second patterning process comprises:

sequentially depositing the transparent oxide layer and the gate insulating layer on the transparent substrate subjected to the first patterning process;

coating a photoresist layer on the gate insulating layer; and etching after exposure and development are performed on the photoresist layer with a double-tone mask, so as to form the pattern of the gate insulating layer; and etching again after an ashing process is performed on the photoresist layer, so as to form the pattern of the active layer.

6. The method for manufacturing the thin film transistor array substrate claimed as claim 5, wherein the sequentially depositing of the transparent oxide layer and the gate insulating layer on the transparent substrate subjected to the first patterning process comprises:

depositing the transparent oxide layer with a thickness in the range of 20~50 nm on the transparent substrate subjected to the first patterning process by means of magnetron sputtering; and depositing the gate insulating layer with a thickness in the range of 300~400 nm on the transparent oxide layer by means of plasma enhanced chemical vapor deposition or magnetron sputtering.

7. The method for manufacturing the thin film transistor array substrate claimed as claim 6, wherein IGZO, ZnO or IZO is applicable for the transparent oxide layer;

when the gate insulating layer is deposited by means of magnetron sputtering, Al2O3 or AlN is applicable for the gate insulating layer; and when the gate insulating layer is deposited by means of plasma enhanced chemical vapor deposition, SiO2 or SiNx is applicable for the gate insulating layer.

8. The method for manufacturing the thin film transistor array substrate claimed as claim 1, wherein the third patterning process comprises:

sequentially depositing the second transparent conductive layer and the second metal layer on the transparent substrate subjected to the second patterning process;

coating a photoresist layer on the second metal layer; and etching after exposure and development are performed on the photoresist layer with a double-tone mask, so as to form the patterns of the gate electrode and the gate line, which are formed by the second metal layer; and etching again after an ashing process is performed on the photoresist layer, so as to form the pattern of the common electrode formed by the second transparent conductive layer.

9. The method for manufacturing the thin film transistor array substrate claimed as claim 8, wherein the sequentially depositing of the second transparent conductive layer and the second metal layer on the transparent substrate subjected to the second patterning process comprises:

depositing the second transparent conductive layer with a thickness in the range of 40~70 nm and the second metal layer with a thickness in the range of 200~400 nm on the transparent substrate subjected to the second patterning process by means of magnetron sputtering.

10. The method for manufacturing the thin film transistor array substrate claimed as claim 9, wherein IZO or ITO is applicable for the second transparent conductive layer;

at least one of Cr, W, Ti, Ta, Mo, Al and Cu is applicable for the second metal layer.

11. A thin film transistor array substrate, comprising:

a transparent substrate;

a pixel electrode, which is provided on the transparent substrate and formed by a first transparent conductive layer;

a source electrode, a drain electrode and a data line, which are provided on the pixel electrode and formed by a first metal layer;

an active layer, which is provided on the transparent substrate and formed by a transparent oxide layer;

a gate insulating layer, which is provided on the active layer;

a common electrode, which is provided on the gate insulating layer and formed by a second transparent conductive layer; and a gate electrode and a gate line, which are provided on the common electrode and formed by a second metal layer.

12. An electronic device comprising the thin film transistor array substrate claimed as claim 11.

* * * * *